United States Patent
Lizama et al.

(10) Patent No.: US 9,941,873 B2
(45) Date of Patent: Apr. 10, 2018

(54) METHOD AND APPARATUS FOR BALANCING CURRENTS

(71) Applicant: ABB Oy, Helsinki (FI)

(72) Inventors: Ignacio Lizama, Dresden (DE);
Rodrigo Alonso Alvarez Valenzuela, Nürnberg (DE); Steffen Bernet, Dresden (DE); Matti Laitinen, Kirkkonummi (FI)

(73) Assignee: ABB Oy, Helsinki (FI)

( * ) Notice: Subject to any disclaimer, the term of this patent is extended or adjusted under 35 U.S.C. 154(b) by 230 days.

(21) Appl. No.: 14/567,461

(22) Filed: Dec. 11, 2014

(65) Prior Publication Data
US 2015/0162902 A1 Jun. 11, 2015

(30) Foreign Application Priority Data
Dec. 11, 2013 (EP) .................................. 13196677

(51) Int. Cl.
*H03K 17/04* (2006.01)
*H03K 17/042* (2006.01)
(Continued)

(52) U.S. Cl.
CPC ......... *H03K 17/042* (2013.01); *H03K 17/082* (2013.01); *H03K 17/12* (2013.01); *H03K 2217/0027* (2013.01)

(58) Field of Classification Search
CPC ...... H03K 17/12; H03K 17/082; H03K 17/10; H03K 17/127; H03K 17/14; H03K 17/28;
(Continued)

(56) References Cited

U.S. PATENT DOCUMENTS

| 5,889,663 A | 3/1999 | Tabata et al. |
| 2006/0097764 A1* | 5/2006 | Yeh .......................... H03K 5/12 327/170 |

(Continued)

FOREIGN PATENT DOCUMENTS

| CN | 201285414 Y | 8/2009 |
| EP | 2 178 211 A1 | 4/2010 |
| EP | 2 424 112 A9 | 2/2012 |

OTHER PUBLICATIONS

European Search Report dated Apr. 3, 2014.
Hofer et al., "Paralleling intelligent IGBT power modules with active gate-controlled current balancing", Jun. 23, 1996, pp. 1312-1316.
Hofer-Noser et al., "Monitoring of Paralleled IGBT/Diode Modules", vol. 14, No. 3, May 3, 1999, pp. 438-444.

(Continued)

*Primary Examiner* — Patrick Chen
(74) *Attorney, Agent, or Firm* — Taft Stettinius & Hollister LLP

(57) ABSTRACT

A method and apparatus are provided for balancing currents of two or more parallel-connected power semiconductor switches during an on-state of the switches. A control terminal of each switch is driven by a driver unit. The method includes determining ratios between the currents through the switches. For each switch, the method includes controlling the voltage at the control terminal on the basis of the ratios by controlling a level of a supply voltage of the driver unit of the switch, and after a turn-on commutation transient, modulating the output of the driver unit. The duty cycle of the modulation is controlled to minimize the time required for the transition of the voltage at the control terminal from the one voltage level to another.

18 Claims, 8 Drawing Sheets

(51) Int. Cl.
*H03K 17/082* (2006.01)
*H03K 17/12* (2006.01)

(58) Field of Classification Search
CPC .. H03K 17/30; H03K 17/063; H03K 17/0822; H03K 17/145; H03K 17/168; H03K 17/567; H03K 2017/0806; H03K 2217/0036; H03K 17/005; H03K 17/007; H03K 17/042; H03K 17/081
USPC ........................................................ 327/374
See application file for complete search history.

(56) References Cited

U.S. PATENT DOCUMENTS

| | | | |
|---|---|---|---|
| 2010/0097121 A1 | 4/2010 | Laitinen | |
| 2012/0013369 A1* | 1/2012 | Coteus | H02M 3/33592 327/109 |
| 2012/0098577 A1* | 4/2012 | Lobsiger | H02M 1/088 327/109 |
| 2012/0146705 A1* | 6/2012 | Den Besten | H03K 17/005 327/333 |
| 2013/0049843 A1* | 2/2013 | Jorge | H03K 17/168 327/438 |

OTHER PUBLICATIONS

Bortis et al., "Active Gate Control for Current Balancing of Parallel-Connected IGBT Modules in Solid-State Modulators", vol. 36, No. 5, Oct. 1, 2008, pp. 2632-2637.

Chen et al., "The Techniques of the Serial and Paralleled IGBTs", vol. 2, Aug. 2, 1996, pp. 999-1004.

International Rectifier, "Application Characterization of IGBTs", 2002, AN-990 rev2, 20 pages.

Dynex Semiconductor, Parallel Operation of Dynex IGBT Modules, Jul. 2002, AN5505-1.3, 5 pages.

Médaule et al., "Parallel Operation of High Power IGBTs", 1995, 9 pages.

Musumeci et al., "Parallel Strings of IGBTs in Short Circuit Transients: Analysis of the Parameter Influence and Experimental Behavior", 2002, pp. 555-560.

Hermann, "Untersuchung Der Parallelschaltung Von Integrierten Gate-Kommutierten Thyristoren Und Dioden Für Hochstromanwendungen", 2009, 180 pages.

English Translation of Chinese Office Action dated Nov. 30, 2016; Chinese Application No. 201410749182.2; Applicant: ABB Oy; 7 pgs.

\* cited by examiner

METHOD AND APPARATUS FOR BALANCING CURRENTS

RELATED APPLICATION

This application claims priority to European Application 13196677.2 filed in Europe on Dec. 11, 2013. The entire contents of these applications are hereby incorporated by reference in their entireties.

FIELD

The present disclosure relates to balancing currents of parallel-connected semiconductor components, and more particularly, to balancing the currents in stationary situations.

BACKGROUND INFORMATION

Increasing demand for large power ratings and physically limited maximum current density of semiconductor devices have made a parallel connection of semiconductors an attractive approach for high power applications. For example, a parallel connection of insulated gate bipolar transistors (IGBTs) is a widely used solution in high power converters.

However, the current through the parallel connection may not distribute evenly between the parallel-connected switching devices. Current imbalances may occur during the on-state (stationary operation) and/or during commutation transients (dynamic operation). If the currents are not balanced, the stresses of the switching devices may also be unbalanced. Stresses may concentrate on a particular switching device or particular switching devices.

In order to achieve a stationary balance of the currents of parallel-connected switching devices, various approaches have been developed. Most of these approaches are based on derating and/or selecting the semiconductors. However, derating the semiconductors (see references [1] and [2] below) may cause a reduced utilization of the silicon die and, therefore, higher costs. Further, the semiconductor dies may have to be selected in order to ensure the operation of each die within the safe operating area defined in the data sheet. Picking semiconductors (see references [1] and [2] below) according to certain device parameters (e.g. gate-emitter threshold voltage, switching times, on-state voltage, etc.) may cause additional costs in the selection procedure and, thus, complicate service, maintenance and converter part replacement.

Current may also be balanced by an active adjustment control of the maximum value of the gate-emitter voltage (see reference [3] below) on the basis of the collector current measurement. However, this approach may be too expensive to be implemented in a commercial converter due to the required measurement of device currents. Furthermore, the active control of the maximum value of the gate-emitter voltage may show low performance due to the coupling of the stationary and dynamic balancing of the semiconductors.

Current balancing may also be achieved through symmetrical design (including mechanical layout) of the converter structures regarding stray inductances (see references 4-6 below). A drawback of this approach is that a symmetric implementation of the converter may generate higher development and manufacturing costs, and add limitations to the mechanical layout and design of the converter.

All of the above-mentioned measures may cause an additional expense of material, development costs as well as manufacturing costs, and make service complicated and difficult.

SUMMARY

An exemplary embodiment of the present disclosure provides a method for balancing currents of two or more parallel-connected power semiconductor switches during an on-state of the switches. A control terminal of each switch is driven by a driver unit. The exemplary method includes determining ratios between the currents through the switches. For each switch, the exemplary method includes controlling the voltage at the control terminal on the basis of the ratios by controlling a level of a supply voltage of the driver unit of that switch, and after a turn-on commutation transient, modulating an output of the driver unit, wherein the duty cycle of the modulation is controlled to minimize a time required for a transition of the voltage at the control terminal from one voltage level to another.

An exemplary embodiment of the present disclosure provides an apparatus configured for balancing currents of two or more parallel-connected power semiconductor switches during an on-state of the switches. A control terminal of each switch is connected to a driver unit. The exemplary apparatus includes means for determining ratios between the currents of the switches. For each switch, the exemplary apparatus includes, means for calculating a supply control signal on the basis of the ratios, means for controlling a supply voltage for the driver unit of the switch on the basis of the supply control signal, and means for modulating an output of the driver unit after a turn-on commutation transient, wherein the duty cycle is configured to be controlled to minimize a time required for the transition from one voltage level to another.

An exemplary embodiment of the present disclosure provides a non-transitory computer-readable recording medium having a computer program tangibly recorded thereon that, when executed, causes the processor to execute a method for balancing currents of two or more parallel-connected power semiconductor switches during an on-state of the switches. A control terminal of each switch is driven by a driver unit. The exemplary method includes determining ratios between the currents through the switches. For each switch, the exemplary method includes controlling the voltage at the control terminal on the basis of the ratios by controlling a level of a supply voltage of the driver unit of that switch, and after a turn-on commutation transient, modulating an output of the driver unit, wherein the duty cycle of the modulation is controlled to minimize a time required for a transition of the voltage at the control terminal from one voltage level to another.

BRIEF DESCRIPTION OF THE DRAWINGS

Additional refinements, advantages and features of the present disclosure are described in more detail below with reference to exemplary embodiments illustrated in the drawings, in which.

DETAILED DESCRIPTION

Figure 1:
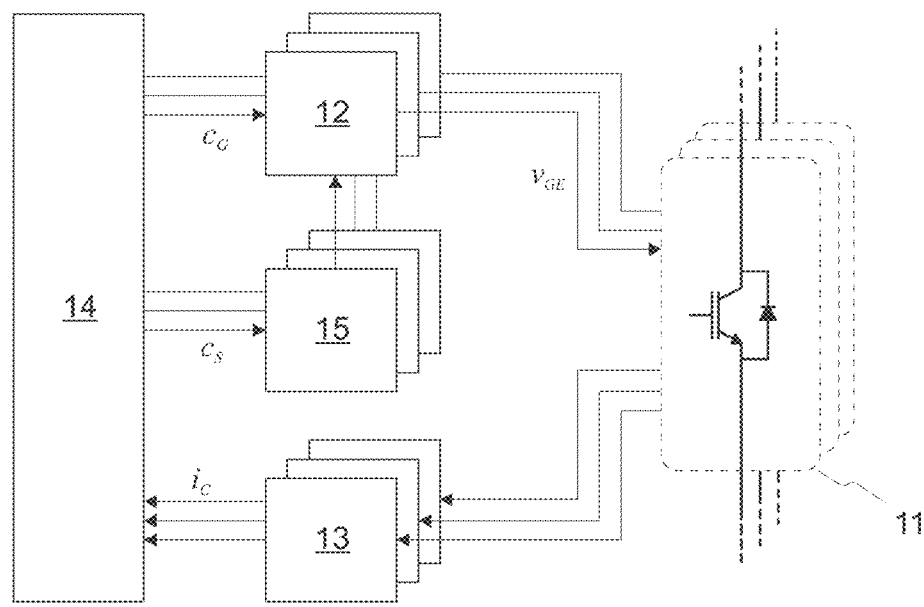
FIG. 1 is a block diagram of an implementation of the method according to an exemplary embodiment of the present disclosure.

Exemplary embodiments of the present disclosure provide a method and an apparatus which alleviate the above-described disadvantages associated with known techniques. Exemplary embodiments of the present disclosure provide a method and an apparatus for balancing currents of two or more parallel-connected power semiconductor switches during an on-state of the switches, wherein a control terminal of each switch is driven by a driver unit.

Exemplary embodiments of the present disclosure are based on controlling values of control terminal voltages (e.g. gate-emitter or gate-source voltages) of parallel-connected power semiconductor switches during the on-state (i.e. conducting state) of the switches in order to achieve a stationary current balance of the power semiconductor switches. The stationary current balance can be separated from the dynamic current balance by controlling the maximum values the control terminal voltages can reach after the turn-on commutation transients.

The maximum values of control terminal voltages can be controlled by controlling supply voltages supplying driver unit units which drive the voltages at the control terminals of the switches. A driver unit may be a gate driver circuit, for example. The supply voltages may be produced responsive to supply control signals by using DC-DC switching converters, for example.

The control terminal voltages may be controlled on the basis of ratios between currents through the power semiconductor switches. The currents through the switches may be determined on the basis of voltages over inductances in the main paths of the semiconductor switches, for example. A direct measurement of the device currents can be avoided, and the method can be implemented without expensive and bulky additional components.

In order to improve dynamic response when adjusting the control terminal voltages, the outputs of the gate driver units may be pulse-width modulated while the DC-DC converters change their output voltages.

The method and apparatus of the present disclosure are able to decouple the stationary and dynamic balancing of the parallel-connected IGBTs and show a fast dynamic response and high stability. The method and apparatus of the present disclosure allow for stationary current balancing of various types of parallel semiconductor devices (e.g. IGBTs, MOSFETs, IGCTs) which allows non-complicated service of converters and replacement of semiconductor modules and/or gate units.

In accordance with the method and apparatus of the present disclosure, costs, weight and volume can be kept low, while little or no losses are added. The method and apparatus have high reliability and thus enable the saving of labor costs during the development, manufacturing and servicing of the converters.

An exemplary embodiment of the present disclosure provides a method for balancing currents of two or more parallel-connected power semiconductor switches during an on-state of the switches, wherein a control terminal of each switch is driven by a driver unit.

An exemplary embodiment of the present disclosure provides an apparatus implementing the method. A frequency converter or a plurality of parallel-connected frequency converters may act as such an apparatus, for example.

Semiconductor switches may operate in one of two states: an off-state (non-conducting state) or an on-state (conducting state). The control terminal voltage is used for driving such a switch into these states. In the on-state of certain switching devices, such as IGBTs, MOSFETs, IGCTs, the current through the switching device is still responsive to the voltage level at its control terminal. Thus, in order to achieve balanced currents of the power semiconductor switches during the on-state of the switches, i.e. a stationary current balance of the switches, the voltage levels of the driver unit outputs driving the switches to the on-state may be adjusted.

To balance the currents, present ratios between the currents of the switches may first be determined. Then, for each switch, a voltage at the control terminal may be controlled on the basis of the ratios. The voltage at the control terminal may be controlled by controlling a level of a supply voltage used by the driver unit of the switch. If the control terminal voltage levels are adjusted after the commutation transients of the switches, the stationary current balancing can be separated from the dynamic current balancing so that they do not interfere with each other.

In some exemplary embodiments of the method of the present disclosure, the output of the driver unit of each switch may be pulse-width modulated after a turn-on commutation transient. The duty cycle of the pulse-width modulation (PWM) may be controlled to minimize time required for the transition of the control terminal voltage from the one voltage level to another.

FIG. 1 is a block diagram of an implementation of the method according to an exemplary embodiment of the present disclosure. In FIG. 1, a plurality of switching devices 11, in this case IGBTs, are connected in parallel. The switches may also be other voltage controlled semiconductor switching devices, such as MOSFETs or IGCTs, for example. Driver units 12 are gate drivers which control the control terminal voltages of the switching devices 11. In this case, the control terminal voltages are the gate-emitter voltages $v_{GE}$ of the IGBTs 11. The driver units 12 drive the IGBTs 11 to the conducting state or to the non-conducting state on the basis of gate control signals $c_G$ they receive from a controller. The maximum values of the gate-emitter voltages $v_{GE}$ can be adjusted after the commutation transients of the switches 11 in order to achieve stationary current balance.

In FIG. 1, current measurement units 13 (e.g., current measurement meters) are used for determining the currents though the switches 11. The currents are collector currents $i_C$ in FIG. 1. A balance controller 14 receives the estimates from the current measurement units 13 and calculates the ratios between the currents. The balance controller 14 may be an FPGA, for example. The balance controller 14 may also be a processor (general purpose or application specific) of a computer processing device (e.g. a desktop computer, laptop computer, tablet computer, etc.), where the balance controller 14 executes a computer program tangibly recorded on a non-transitory computer-readable recording medium (e.g., a non-volatile memory such as a ROM, hard disk drive, flash memory, optical memory, etc.) resident in the computer processing device. The balance controller 14 is configured to equalize the ratios between the currents. The balance controller controls supply units 15 which provide supply voltages to the driver units 12. The output voltages of the supply units 15 may be controlled on the basis of supply control signals $c_s$ from the balance controller 14, as in the example of FIG. 1. By controlling the supply voltages, the balance controller 14 is able to control the levels of the gate-emitter voltages the driver units 12 are generating.

According to an exemplary embodiment, the supply units 15 may be DC-DC switching converters, and the supply control signals $c_s$ may be in the form of PWM signals which control the duty cycles of DC-DC converters 15. Depending on the requirements of control terminal voltages, the supply units 15 may be implemented in various ways (e.g., power supply devices).

During the turn-on commutation transients, a standard gate-emitter voltage may be used for all switches 11, but after the commutation transients, the levels the gate-emitter voltages of the switches 11 may be actively controlled in order to achieve the stationary current balancing.

In order to determine the amount of stationary imbalance in the currents through the switches 11, the currents may be measured by using current sensors such as Rogowski coils, open-loop or closed-loop current transducers or other measurement devices. However, it may not be necessary to know precise values of the currents, but only the ratio(s) of the currents with respect to each other. Thus, instead of known current measurements, the ratios between the currents may be determined by other means.

Currents can be estimated by determining a voltage over an inductance in the main path of the semiconductor switch. For example, the ratios between the currents of the switches may be determined by estimating the currents, such as the collector currents, of the switches on the basis of bond voltages, for example, voltages across stray inductances formed by chip bonding, or other stray inductances in series with the power semiconductor switches, and then by calculating the ratios on the basis of the estimated currents. In this manner, the currents and ratios can be estimated without use of a current sensor.

Figure 2:
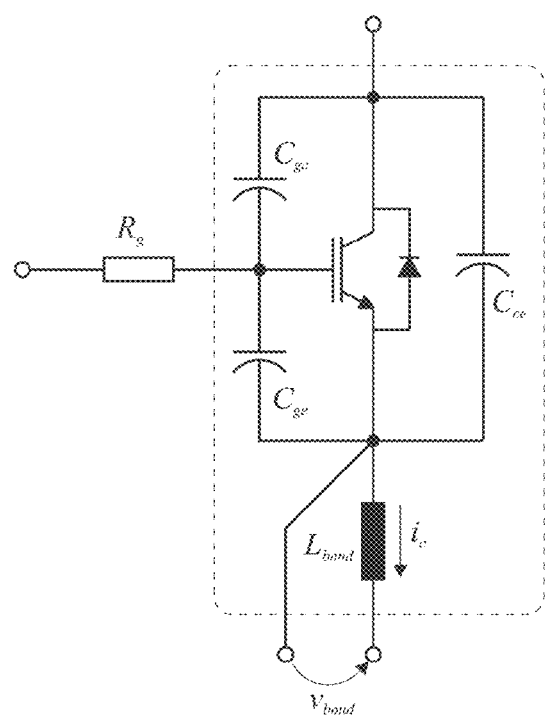
FIG. 2 shows a simplified model of an IGBT.

For example, an internal stray inductance of an IGBT or an IGBT module may be used for current estimation. FIG. 2 shows a simplified model of an IGBT. The model shows an internal gate-emitter capacitance $C_{GE}$, collector-gate capacitance $C_{CG}$, and collector-emitter capacitance $C_{CE}$. The model further shows an internal stray capacitance $L_{bond}$ which may represent a bonding between the emitter on the IGBT chip and a power emitter terminal of the IGBT module, for example. The IGBT module also has an auxiliary emitter terminal. A voltage $v_{bond}$ over the inductance $L_{bond}$ can then be measured between the power emitter terminal and the auxiliary emitter terminal. The model further shows a gate resistance connected to the gate of the IGBT.

The internal voltage $v_{bond}$ across the stray inductance $L_{bond}$ is proportional to the slope of the collector current $i_C$ in the following manner:

$$L_{bond}\frac{di_c}{dt} = v_{bond}. \tag{1}$$

Thus, the collector current $i_C$ may be calculated as the integral of the bond voltage $L_{bond}$:

$$\Rightarrow \frac{1}{L_{bond}} \int_{t_1}^{t_2} v_{bond}\, dt = i_c, \tag{2}$$

where $t_1$ and $t_2$ are integration limits.

On the basis of Equation 2, the current through a switch may be estimated by integrating a bond voltage (or a voltage over other inductance in series with the switch) for a period of time, measuring the integrated voltage, and estimating the current on the basis of the integrated voltage. The voltage may be measured and integrated by using an analog integrator, for example.

Figure 3A:
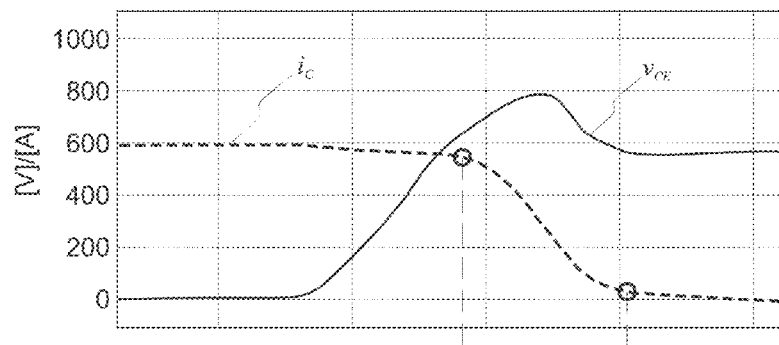
FIGS. 3a to 3c illustrate the concept of estimation by integrating the bond voltage according to an exemplary embodiment of the present disclosure.
Figure 3B:
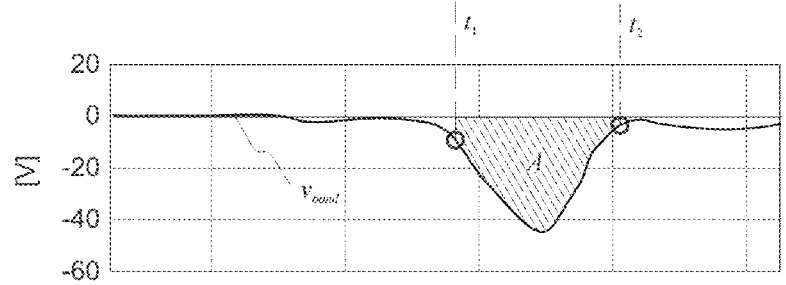
Figure 3C:
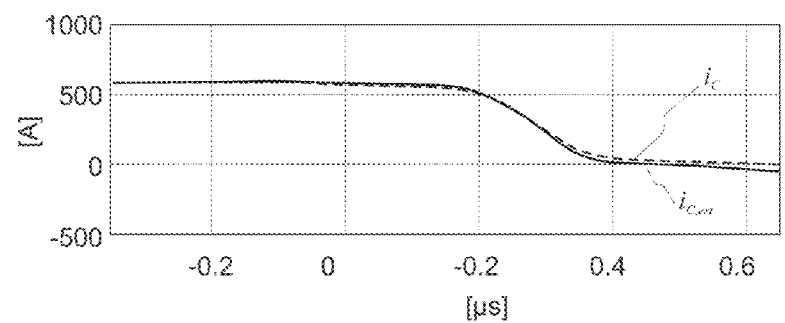

FIGS. 3a to 3c illustrate the concept of estimation by integrating the bond voltage $v_{bond}$. In FIG. 3a, a collector-emitter voltage $v_{CE}$ and a collector current $i_C$ of the switch are shown. The collector current $i_C$ induces the bond voltage $v_{bond}$ over the switch bonding. FIG. 3b shows the bond voltage. Together with the integration limits $t_1$ and $t_2$, the bond voltage $v_{bond}$ and the x-axis define a closed surface A in FIG. 3b. The surface area of the closed surface A is the integral of the bond voltage $v_{bond}$ with the integration limits $t_1$ and $t_2$ and can be used for calculating an estimated collector current $i_{C,est}$. The integration limits $t_1$ and $t_2$ in FIG. 3b may be set by integrating only when the bond voltage $v_{bond}$ is less than a set limit, for example. When the voltage is higher than the limit, the integrator may be forced zero.

FIG. 3c shows the surface area of the closed surface A, e.g., an estimated collector current $i_{C,est}$, as a function of time. Superimposed with the estimated collector current $i_{C,est}$ is the actual measured current $i_C$. As shown in FIG. 3c, the estimate $i_{C,est}$ follows the actual current $i_C$ quite closely.

Figure 4:
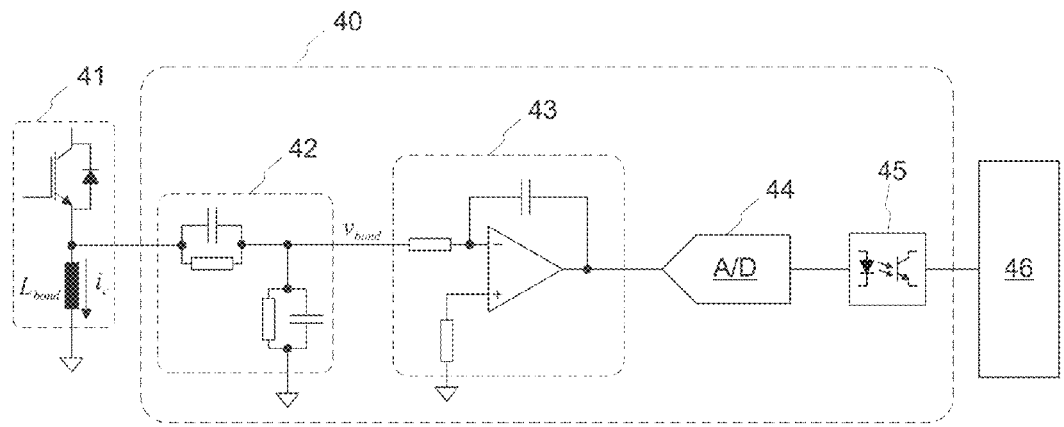
FIG. 4 shows a simplified current measurement based on integration of the voltage across a bond inductance of an IGBT, according to an exemplary embodiment of the present disclosure.

FIG. 4 shows a simplified exemplary embodiment of a current measurement based on integration of the voltage across a bond inductance $L_{bond}$ of one of parallel-connected IGBTs 41. The exemplary current measurement of FIG. 4 may be used for the current measurement units 13 of FIG. 1, for example.

In FIG. 4, the bond voltage $v_{bond}$ is measured during the turn-off transient by using a voltage sensing circuit 42 including a compensated (resistive-capacitive) voltage divider. The sensed voltage $v_{bond}$ is integrated by using an inverting integrator 43. The output of the integrator 43 represents the current though the bond inductance $L_{bond}$ before the turn-off transient. The integrator 43 may include a reset that prevents the integrator 43 from drifting during the time outside the integration limits.

The output of the integrator 43 is fed to an A/D converter 44 which converts the integrator 43 output signal to a digital representation. As the switches 41 may be at different voltage potentials with respect to the balance controller 46, the A/D converter 44 transmits a digital value or values of the integrator 43 output to the balance controller through an optical isolator 45.

As an alternative to estimation by integrating the voltage over an inductance in series with the switch, a current through a switch may be performed by comparing the voltage with a threshold value. The voltage is proportional to the slope of the current through the inductance, as shown in Equation 1. When the voltage is compared to a suitable threshold value during the turn-off transient of the switch, the comparison generates a pulse signal, the length of which is proportional to the value of the current before the turn-off transient. The time the voltage exceeds the threshold may be measured, and the current may be estimated on the basis of the measured time.

Figure 5A:
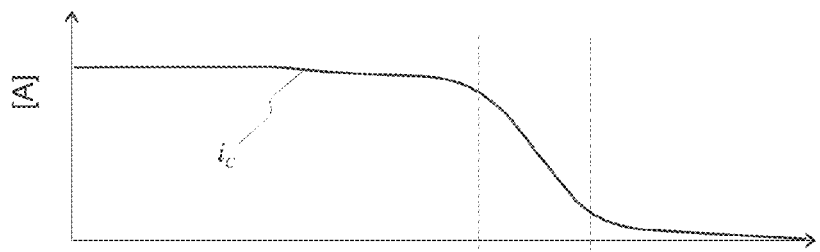
FIGS. 5a to 5c illustrate the concept of estimation by comparison, according to an exemplary embodiment of the present disclosure.
Figure 5B:
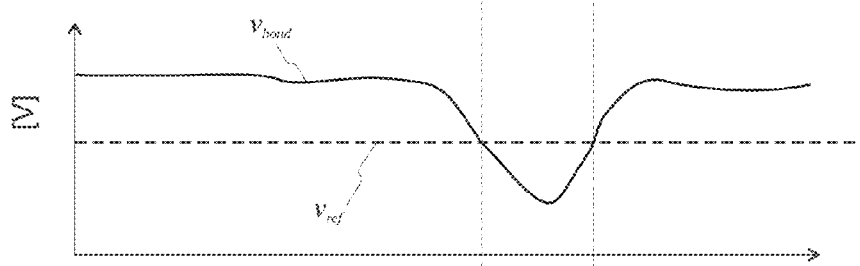
Figure 5C:
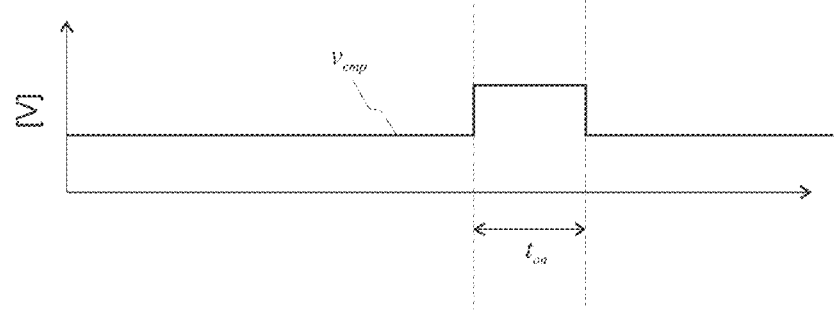

FIG. 5 shows exemplary waveforms of estimating collector current $i_C$ by comparing a bond voltage $v_{bond}$ with a threshold voltage $v_{ref}$. During the turn-off transient, the collector current $i_C$ drops in FIG. 5. The bond voltage $v_{bond}$ follows the rate of change (slope) of the collector current $i_C$. The bond voltage $v_{bond}$ is compared with the threshold voltage $v_{ref}$. The voltage $v_{cmp}$ represents the output of the comparison. When the bond voltage $v_{bond}$ exceeds the reference voltage $v_{ref}$, the voltage $v_{cmp}$ is set to a high voltage level. Otherwise, the voltage $v_{cmp}$ is at a low voltage level. Thus, voltage $v_{cmp}$ forms a pulse shape. As the length $t_{on}$ of the pulse is proportional to the collector current $i_C$ before the turn-off transient and can be used to estimate the current $i_C$.

Figure 6:
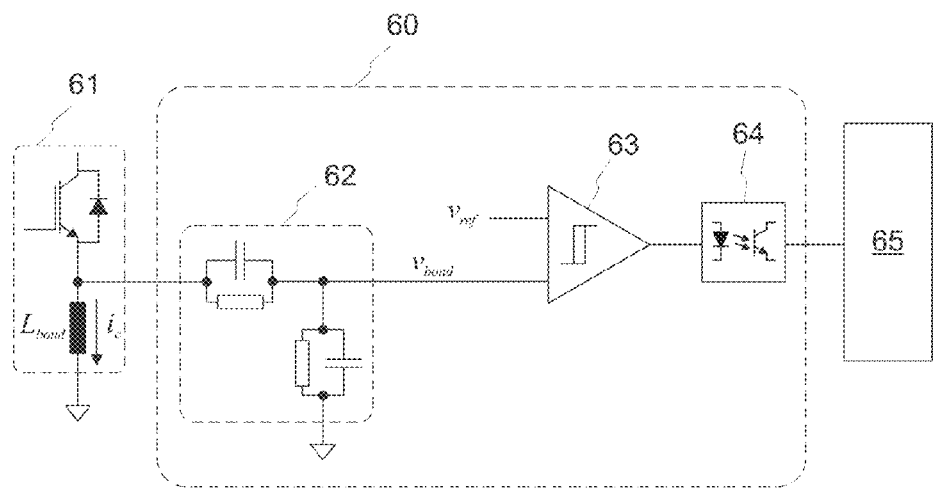
FIG. 6 shows a simplified current measurement based on estimation through comparison, according to an exemplary embodiment of the present disclosure.

FIG. 6 shows a simplified exemplary embodiment of a current measurement 60 based on estimation through comparison. The bond voltage $v_{bond}$ of a switch 61 is sensed by using a compensated voltage divider 62. A comparator 63 compares the sensed voltage $v_{bond}$ with a small reference value $v_{ref}$ and the result is transmitted to the balance controller 65 through an optical isolator 64 which provides galvanic isolation. The balance controller 65 evaluates the duration of the pulse in order to estimate the current $i_C$.

In order to compensate structural differences between the parallel-connected IGBTs and the peripheral circuitry, both of the above disclosed current estimation methods may implement a calibration sequence with a single device at constant currents. The calibration may be as simple as a double pulse test or other pulse pattern and may be added in the start-up routine of a frequency converter implementing the disclosed method, for example.

When the balance controller has the estimated current values, it may calculate the ratios between the currents of the switching devices. When the ratios between the currents have been determined, levels of supply voltage supplying the driver units of each of the switches may be controlled on the basis of the ratios. The control terminal voltages of the switches can be controlled by adjusting the supply voltages. If the determined ratios show that the currents are not even, the voltage levels at the control terminals of the switches may be adjusted so that the currents become equalized.

The balancing algorithm may be implemented by means of a PI controller configured to equalize the ratios between the currents, for example. The balance controller may vary the maximum control terminal voltages after the end of the next turn-on transient in order to achieve a stationary balance of the current of parallel-connected switching devices. The balance controller may calculate a supply control signal for each switch on the basis of the determined the ratios. The voltage levels of the driver units in the on-state may then be controlled on the basis the supply control signals. The supply voltages may be generated by using DC-DC converters capable of actively changing the value of their output voltages, and the DC-DC converters may be controlled responsive to the supply control signals. The supply control signals may be PWM signals controlling the DC-DC converters, for example.

The balance controller may calculate a correction factor for each of the currents, which determine either a reduction or an increase of each control terminal voltage. For example, if two IGBTs are connected in parallel and the first IGBT is carrying 25% larger current than the second IGBT, the currents may be balanced in the following manner. The gate-emitter voltage of the first IGBT may be reduced, which increases the on-state voltage of the first IGBT for a given current. As a consequence, the current through the second IGBT is also increased.

Alternatively, the gate-emitter voltage of the second IGBT may be increased, which decreases the on-state voltage of the second IGBT for a given current. As a consequence, the current carried by the second IGBT increases. When the gate-emitter voltage is increased, however, care should be taken that other limitations of the gate-emitter voltage are not exceeded, like the maximum allowable gate-emitter voltage (normally about 20 V), or other limitations imposed on this voltage, for example, by the short circuit operation, EMI issues, etc. The decreases/increases in the gate-emitter voltages may each be scaled according to the output characteristic of the IGBTs.

Depending on the approach, the DC-DC converter may be implemented as a buck or boost converter allowing the reduction or increase in the gate-emitter voltage.

Figure 7:
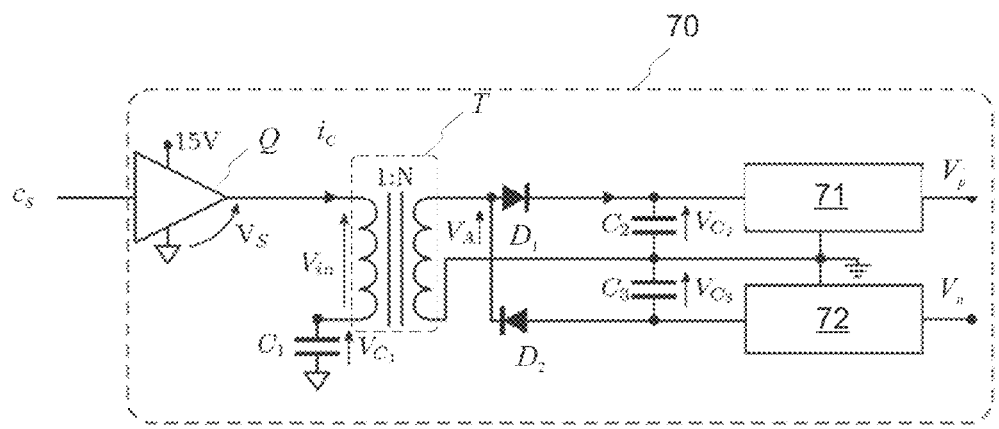
FIG. 7 illustrates an implementation of a DC-DC converter acting as a supply unit supplying a driver unit, according to an exemplary embodiment of the present disclosure.

FIG. 7 illustrates an exemplary implementation 70 of a DC-DC converter acting as a supply unit 14 supplying a driver unit 12 in FIG. 1, according to an exemplary embodiment of the present disclosure. In FIG. 7, a buffer Q is used for driving a primary winding of a transformer T. The buffer Q has a PWM signal $c_S$ as an input. The buffer Q converts the input signal $c_S$ to a voltage $v_S$ which alternates between levels 0V and 15V. The primary winding is connected in series with a capacitor $C_1$ which generates duty cycle dependent bias voltage $v_{C1}$ to the voltage $v_{in}$ over the primary winding.

The voltage $v_{in}$ over the primary winding induces a voltage $v_A$ on the secondary winding of the transformer T. Diodes $D_1$ and $D_2$ rectify this voltage into two output voltages $v_{C2}$ and $v_{C3}$ over two capacitors $C_2$ and $C_3$, respectively. The voltages $v_{C2}$ and $v_{C3}$ are limited by using voltage limiters 71 and 72, which ensure that the voltages $v_{C2}$ and $v_{C3}$ do not exceed the maximum limits set to them. The outputs of the limiters 71 and 72 form a positive supply voltage $V_p$ and a negative supply voltage $v_n$. The limiters 71 and 72 may be zener-diodes, for example.

By altering the duty cycle of the PWM signal $c_S$ and, thus, the voltage $v_S$, it is possible to alter the positive supply voltage $V_p$ and the negative supply voltage $v_n$.

Figure 8A:
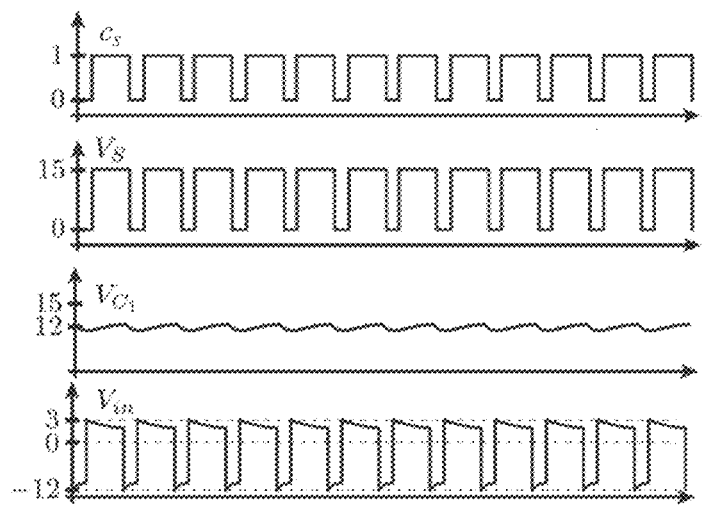
FIGS. 8a to 8c show some exemplary waveforms of the DC-DC converter.
Figure 8B:
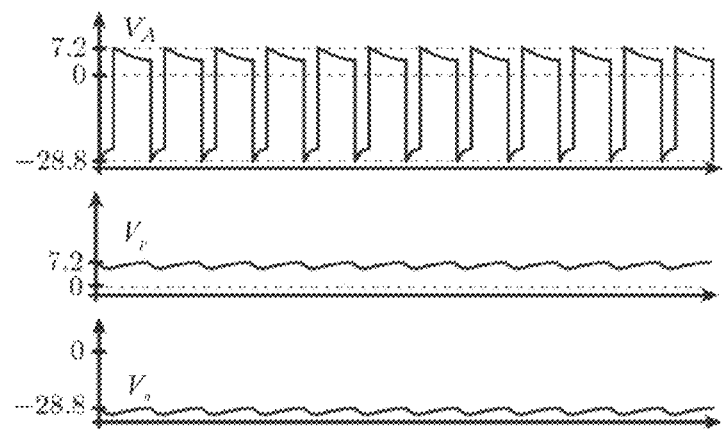
Figure 8C:
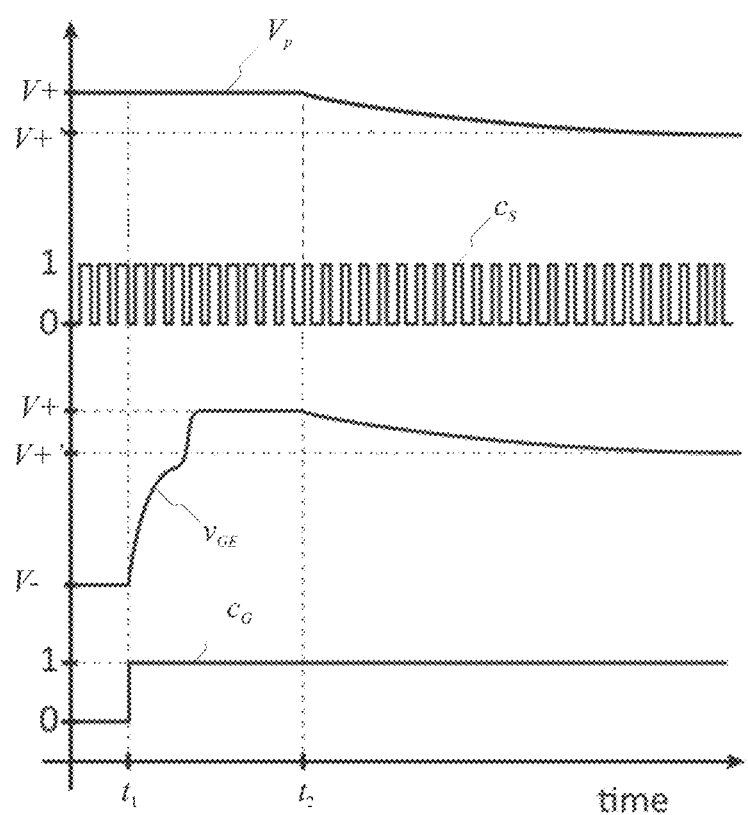

FIGS. 8a to 8c show some exemplary waveforms of the DC-DC converter in FIG. 7. FIG. 8a shows a voltage $v_S$ generated by the buffer Q. The voltage $v_S$ is responsive to a supply control signal $c_S$ which has a duty cycle of 80% in FIG. 8a. This results in a pulsating voltage $v_{in}$ over the primary winding. The voltage $v_{in}$ over the primary winding has peak values of 3 V and −12V. The voltage generates a voltage $v_A$ over the secondary winding. The transformer has the turns ratio of 1:2.4. As a result, the voltage $v_A$ has peak values of 7.2 and −28.8V, as shown in FIG. 8b. The voltage $v_A$ is then rectified by diodes $D_1$ and $D_2$ thereby generating the positive supply voltage $V_p$ and the negative supply voltage $v_n$.

FIG. 8c shows exemplary waveforms during a turn-on event. Before instant $t_1$, the supply control signal $c_S$ has a duty cycle that generates a voltage level V+ for the positive supply voltage $V_p$. A gate control signal $c_G$ is held in off-state, and thus, the gate-emitter voltage $v_{GE}$ is held tied to the negative supply voltage $V_n$.

At instant $t_1$, a gate control signal $c_G$ is set to on-state. Thus, the gate-emitter voltage $v_{GE}$ is driven to the positive supply voltage $V_p$ which is at voltage level V+.

From instant $t_2$ on, the supply control signal $c_S$ modulates at a different duty cycle, and after a while, the positive supply voltage $V_p$ settles at a new, lower voltage level V+'. The gate-emitter voltage $v_{GE}$ follows the positive supply voltage $V_p$.

Balancing the stationary currents through altering the duty cycle of a DC-DC converter generating a supply voltage or supply voltages for a driver unit has several advantages. Exemplary advantages are its simplicity, stability and robustness. However, the method may have slow dynamics because of output capacitances of the DC-DC converters.

The slow dynamics may be improved by using smaller capacitances on $C_2$ and $C_3$. However, this may also increase the voltage ripple of the output voltages, thus, deteriorating the stability of the system. For this reason, other methods may be required for achieving faster dynamics in some embodiments.

In some embodiments, very high dynamics can be achieved by utilizing structural features of the switching device. Internal capacitances of the switching device may be utilized in order to generate low pass characteristics at the control terminal of the switching device.

For example, in the model of FIG. 2, the internal gate-emitter capacitance $C_{GE}$ (up to the threshold voltage) and the collector-gate capacitance $C_{CG}$ (until the $v_{GE,max}$) complete an RC low pass filter together with the gate resistance. The cut-off frequency of this filter depends on the capacitances $C_{GE}$ and $C_{CG}$ and the gate resistance. The cut-off frequency may be in the range of 0.5 to 5 MHz, for example.

The control terminal voltage of a switching device may be controlled with very high dynamics if the driver unit output is pulse-width modulated at a high frequency. When the switching frequency of the PWM of the driver unit is at least the cut-off frequency of the low-pass characteristics of the control terminal, the modulated voltage is filtered by the low pass characteristics present in the control terminal.

By using a high-frequency modulation, the control terminal voltage may be controlled to be changed during the turn-on state of the switch. When the high frequency PWM of the driver unit output is performed after the turn-on commutation transient of the switch, the stationary current balancing can be effectively separated from a possible dynamic current balancing. During the turn-on commutation transient, a standard on-state voltage may be used at the driver unit output, for example.

Figure 9:
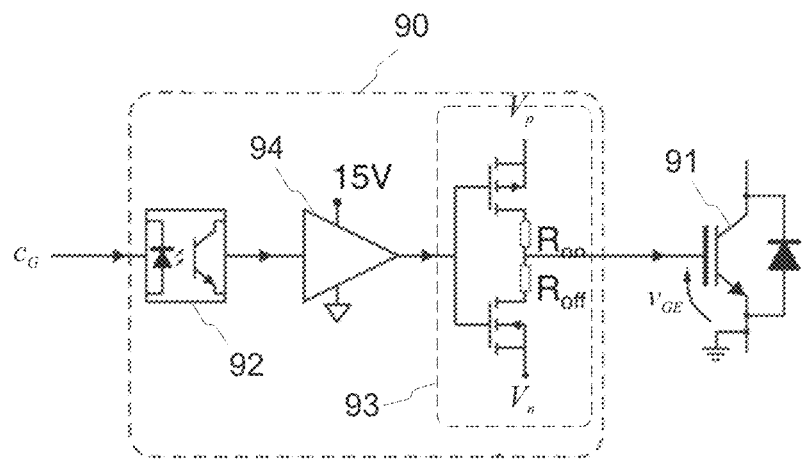
FIG. 9 shows an implementation of a power stage suitable for the driver unit of FIG. 1, according to an exemplary embodiment of the present disclosure.

FIG. 9 shows an exemplary implementation of a power stage 90 suitable for a driver unit 12 of FIG. 1. The power stage 90 may be used for driving the gate-emitter voltage $v_{GE}$ of a switch 91 which is an IGBT in the example of FIG. 9. The power stage 90 includes a buffer circuit 94 which is controlled by the balance controller 14 through an isolator 92, which in this example is an optical isolator. The output of the buffer 92 is converted to IGBT gate voltage levels by using a push-pull output circuit 93. The supply voltages $V_p$ and $V_n$ of the push-pull circuit 93 are generated by a supply unit not shown in FIG. 1. The supply unit may be a DC-DC converter as shown in FIG. 7, for example.

The power stage 90 is able to generate a PWM signal at a high frequency, such as 5 MHz, for example. This PWM signal is filtered by the IGBT 91, and forms a gate-emitter voltage $v_{GE}$.

Figure 10:
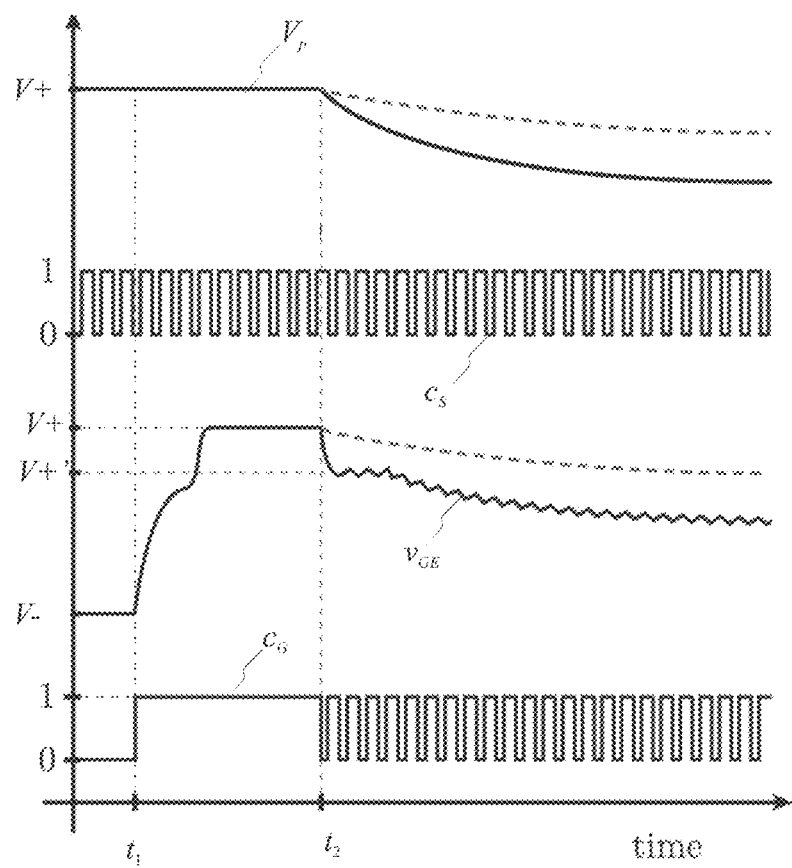
FIG. 10 shows exemplary waveforms of the driver unit power stage and the supply unit.

FIG. 10 shows exemplary waveforms of the supply unit of FIG. 7 and the power stage of FIG. 9. In FIG. 10, the supply control signal $c_S$ has a constant duty cycle that initially generates a voltage level V+ for the positive supply voltage $V_p$.

The controller sets the gate control signal $c_G$ controlling the output of the push-pull circuit 93 to on-state at instant $t_1$. Thus, the gate-emitter voltage is driven to the positive supply voltage $V_p$ at voltage level V+. The gate control signal $c_G$ is held at on-state until the commutation transient has ended.

From instant $t_2$ on, the gate control signal $c_G$ is pulse-width modulated at a constant duty cycle and the output of the push-pull circuit 93 modulates between the positive supply voltage $V_p$ and the negative supply voltage $V_n$, which is at level V−. Compared with the waveforms of FIG. 8c (shown as dashed lines in FIG. 10), the generated gate-emitter voltage $v_{GE}$ shows fast dynamics (e.g., less than 3 µs for a step from 15 to 11 V).

However, the positive supply voltage $V_p$ shows a significant voltage drop which also affects the stability of the generated gate-emitter voltage $v_{GE}$ after the time instant $t_2$. When the gate-emitter voltage $v_{GE}$ is modulated at a high frequency, the power supply may not be able to produce enough power to maintain the supply voltages at desired levels. Thus, the supply voltages may experience a voltage drop as shown in FIG. 10. As a result, the modulated gate-emitter voltage $v_{GE}$ may also experience a voltage drop.

Simplicity of the control and a high dynamic response are some advantages of the above high-frequency PWM of the control terminal voltage. However, stability of the DC-DC supply after the time instant $t_2$ may in some cases pose a problem. In some applications, the stability may be insufficient and the high-frequency PWM cannot be used alone for the improvement of the stationary current distribution of parallel-connected IGBTs, or the reduction of the stationary losses of the semiconductors.

In order to achieve high dynamic characteristics while maintaining good stability, a method combining use of a DC-DC converter with a controllable output and a high frequency PWM modulation of gate-emitter voltage may be used.

In the method, ratios between the currents of the switches may first be determined, and then, for each switch, a level of a control terminal voltage of the switch may be controlled on the basis of the current ratios. The control terminal voltage may be adjusted by controlling a supply voltage of the driver unit. The supply voltages may be generated by using supply units. The supply units may be DC-DC switching converters having duty cycles responsive to supply control signals determined on the basis of the ratios, for example.

For each switch, controlling a supply voltage for the driver unit may include generating a first supply voltage level by using a first duty cycle of the switching converter, and after the turn-on commutation transient, generating a second supply voltage level by using a second duty cycle of the switching converter.

The switching converter may have a period of a third duty cycle between the first duty cycle and the second duty cycle.

The third duty cycle may be set to minimize the transition time from the first supply voltage level to the second supply voltage level.

Figure 11:
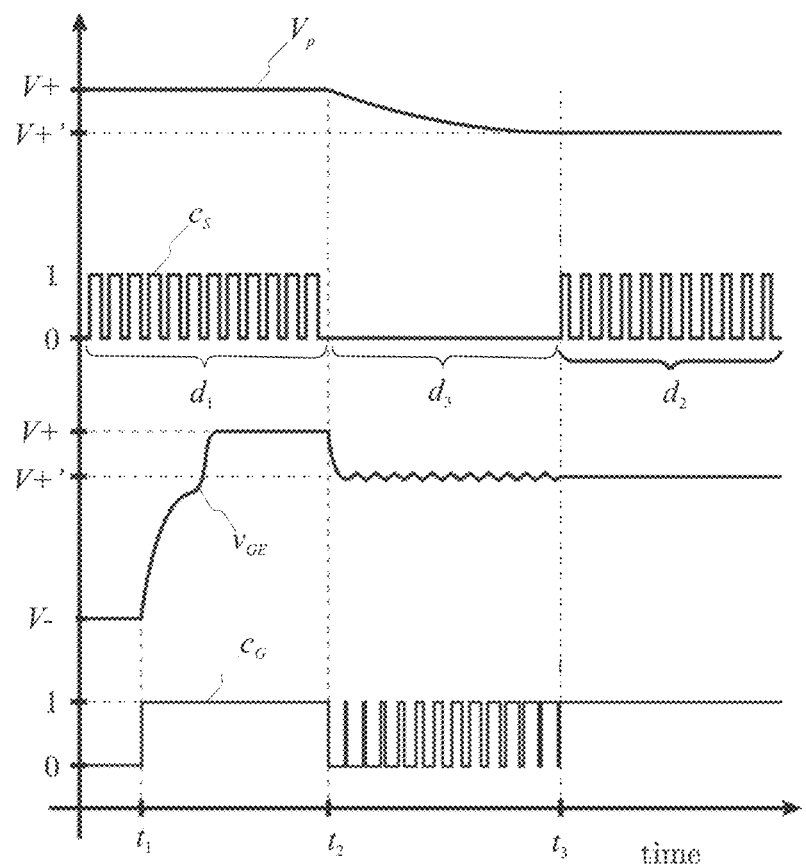
FIG. 11 shows exemplary waveforms of an embodiment of the method of the present disclosure.

FIG. 11 shows exemplary waveforms of the method combining use of a DC-DC converter with a controllable output and a high frequency PWM modulation of gate-emitter voltage. In FIG. 11, a first supply voltage level V+ of a positive supply voltage $V_p$ is generated by using a first duty cycle $d_1$ for the supply control signal $c_S$. During the period between the first and the second duty cycle, the third duty cycle $d_3$ of the supply control signal $c_S$ may be zero and the positive supply voltage $V_p$ is allowed to drop. After waiting a time (e.g. five microseconds in the tested implementation), the positive supply voltage $V_p$ has dropped to the second supply voltage level V+', i.e. to a level desired for balancing the currents of the parallel-connected switches, the pulse-width modulation of the switching converter starts again at the second duty cycle $d_2$ of the supply control signal $c_S$. The second duty cycle $d_2$ produces the second supply voltage level V+' of the positive supply voltage $V_p$.

In order to improve dynamics of the control of the control terminal voltage, the output of the driver unit may be modulated at a high frequency after the turn-on commutation transient has ended. The outputs of the driver units may be at constant on-state during the first and the second duty cycle of the switching converters, and modulated during the period of third duty cycles. During the period of third duty cycle of each supply unit, the respective driver unit output may be modulated at a high frequency. The duty cycle of the modulation may be controlled to minimize the time required for the transition of the control terminal voltage from the one voltage level to another.

In FIG. 11, the gate control signal $c_G$ is held constantly at on-state in during the first duty cycle $d_1$ and the second duty cycle $d_2$ of the supply control signal $c_S$. However, during the third duty cycle $d_3$ of the supply control signal $c_S$, the gate control signal $c_G$ is modulated and the output of the driver unit switches between the positive supply voltage $V_p$ and the negative supply voltage $V_n$. The switching frequency of the modulation of gate control signal $c_G$ is high enough to be filtered out by the low-pass characteristics of the control terminal. As shown in FIG. 11, the duty cycle of the high-frequency modulation of the gate control signal $c_G$ may change during the third duty cycle $d_3$ of the supply control signal $c_S$. The duty cycle of the high-frequency modulation may form a pattern configured to minimise the transition time of the control terminal voltage from first supply voltage level to the second supply voltage.

As shown in FIG. 11, the method achieves a fast dynamic response (e.g., $v_{GE}$ was modified in less than 5 µs) and excellent long-term stability. The DC-DC converter provides long-term stability while the high-frequency PWM modulation of gate-emitter voltage allows fast dynamic capabilities. The disclosed method is able to limit the current imbalance of parallel-connected semiconductor switches during the stationary operation. By using the combination of a DC-DC converter with a controllable output to adjust of the maximum gate-emitter voltage and modulation of gate-emitter voltage to shape the transition of the gate-emitter voltage from one voltage level to another, fast dynamic capabilities may be achieved while maintaining good long-term stability.

FIGS. 12a to 12f and 13a to 13f show exemplary stationary balance of two parallel-connected IGBTs for the known method and for the balance method of the present disclosure, respectively.

Figures 12A, 12B, 12C, 12D, 12E, 12F:
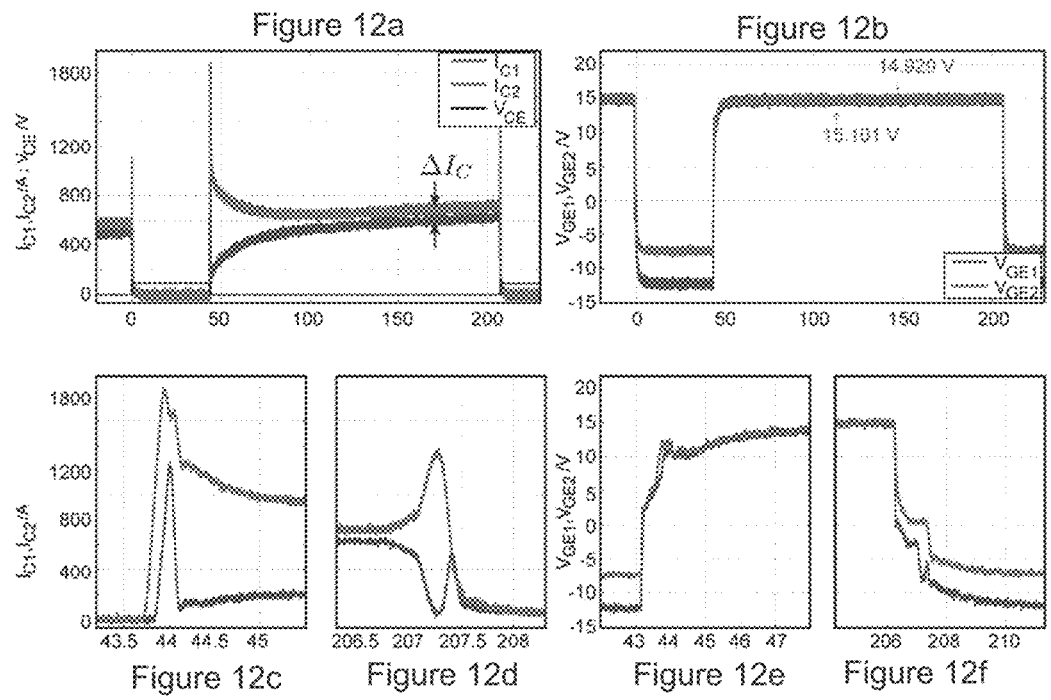
FIGS. 12a to 12f show exemplary stationary balance of two parallel-connected IGBTs for the known balance method.
Figures 13A, 13B, 13C, 13D, 13E, 13F:
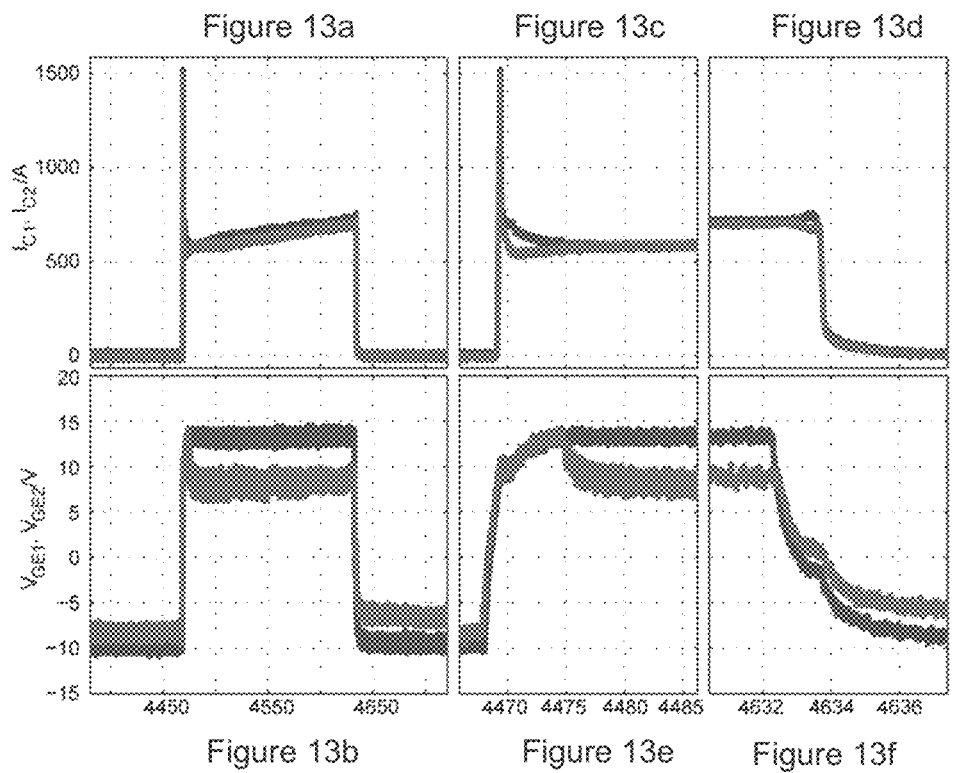
FIGS. 13a to 13f show exemplary stationary balance of two parallel-connected IGBTs for an exemplary embodiment of the balance method according to the present disclosure.

FIG. 12a shows the collector currents of the IGBTs during their on-state. FIG. 12b shows the gate-emitter voltages of the IGBTs. FIGS. 12c and 12d show details of the collector currents at the turn-on event and the turn-off event, respectively. FIGS. 12c and 12d show details of the gate-emitter voltages at the turn-on event and the turn-off event, respectively.

The improvement achieved by the present disclosure's balancing algorithm for parallel-connected IGBTs on the collector current distribution can be seen in the drawings. The stationary unbalance of these two IGBTs is almost completely eradicated.

The method of the present disclosure may be used in conjunction with a dynamic current balancing method. The dynamic current balance can be achieved in the system by using the method proposed in reference [7] below, for example. The hybrid method of the present disclosure can also be used to increase the gate-emitter voltage of the semiconductors reducing the on-state losses.

The presented concepts for the variation of the control terminal voltage and the estimation of current can also be applied to the short circuit detection and limitation, to the reduction of conduction losses, and to the stationary balance of parallel-connected IGBTs.

Implementations of the method of the present disclosure are not limited to the above exemplary embodiments. For example, capacitive or inductive measurements of voltage over the stray capacitance may be used. The voltages may be measured by using an A/D converter or a plurality of A/D converters. Implementations of the measurements without conversion to digital are also possible.

Other current estimation methods may also be used. For example, in the comparator approach, the comparators may have different threshold values. In the integrator estimation approach, the integration may be implemented in various ways digitally or analogically. The use of the algorithms with a measurement of the current with, for example, Rogowski coils, open-loop or closed-loop current transducers or other measurement devices are also possible.

The supply units providing supply voltages for the driver units may also be implemented in various ways. Further, even though FPGA was mentioned as a platform for implementing the balance controller, other approaches may also be used. For example, the implementation of the functions, such as the control of the gate-emitter voltage, may be carried out by analog electronic circuitry. The control may also be implemented on another digital device, such as a CPU, DSP or a microcontroller.

Variations in the parameters to be extracted are also possible. For example, other voltages which are also proportional to the collector current may be used such as a voltage drop over a resistor in the collector current path. It is obvious to a person skilled in the art that the inventive concept can be implemented in various ways. The disclosure and its embodiments are not limited to the examples described above but may vary within the scope of the claims.

It will be appreciated by those skilled in the art that the present disclosure can be embodied in other specific forms without departing from the spirit or essential characteristics thereof. The presently disclosed embodiments are therefore considered in all respects to be illustrative and not restricted. The scope of the disclosure is indicated by the appended claims rather than the foregoing description and all changes that come within the meaning and range and equivalence thereof are intended to be embraced therein.

REFERENCES

[1] Application Characterization of IGBT, Application Characterization of IGBT, 2002. (rev. 2) 80
[2] Parallel Operation of Dynex IGBT Modules, Parallel Operation of Dynex IGBT Modules, July 2002. (rev. 2) 80
[3] CHEN, Jiann-Fuh, LIN, Jiunn-Nan, AI, Tsu-Hua, "The techniques of the serial and paralleled IGBTs." Industrial Electronics, Control, and Instrumentation, 1996, Proceedings of the 1996 IEEE IECON 22nd International Conference on Bd. 2, 1996, S. 999-1004 vol. 2 80

[4] MEDAULE, D.; YU, Y., "Parallel operation of high power IGBTs." IEE Seminar Digests Bd. 2, 1995 80

[5] MUSUMECI, S., PAGANO, R., RACITI, A., FRISINA, F., F. MELITO, M., "Parallel strings of IGBTs in short circuit transients: analysis of the parameter influence and experimental behavior." Proc. IEEE Industrial Electronics, Control and Instrumentation, 2002. IECON '02, 2002 15, 80

[6] HERMANN, R.: Untersuchung der Parallelschaltung von Integrierten Gate-Kommutiertten Thyristoren and Dioden für Hochstromanwendungen. Berlin, Germany, Technische Universitaet Berlin, 2009 5, 6, 26, 30, 79, 80

[7] Alvarez, R; Fink, K.; Bernet, S.; Coccia, A.; "Current balancing of parallel connected semiconductor components" EP 2424112A9, Aug. 23, 2010.

What is claimed is:

1. A method for balancing currents of two or more parallel-connected power semiconductor switches during an on-state of the switches, wherein a control terminal of each switch is driven by a driver unit, the method comprising:
    determining ratios between the currents through the switches;
    for each switch, controlling a voltage at the control terminal on the basis of the ratios by controlling a level of a supply voltage of the driver unit of that switch; and
    for each switch, after a turn-on commutation transient, modulating an output of the driver unit, wherein a duty cycle of the modulation is controlled to reduce a time required for a transition of the voltage at the control terminal from one voltage level to another;
    wherein the supply voltage is generated by using a switching converter having a duty cycle responsive to a supply control signal determined on the basis of the ratios; and
    wherein controlling the level of the supply voltage of the driver unit comprises generating a first supply voltage level by using a first duty cycle of the switching converter, and after the turn-on commutation transient, generating a supply voltage level by using a second duty cycle of the switching converter.

2. A method as claimed in claim 1, wherein the switching converter has a period of a third duty cycle between the first duty cycle and the second duty cycle, and
    wherein the third duty cycle is set to minimize a transition time from the first supply voltage level to the second supply voltage level.

3. A method as claimed in claim 2, wherein the output of the driver unit is at an on-state during the first and the second duty cycles of the switching converter, and is modulated during the period of third duty cycle.

4. A method as claimed in claim 3, wherein the determining of the ratios between the currents of the switches comprises
    estimating the currents of the switches on the basis of bond voltages of the switches; and
    calculating the ratios on the basis of the estimated currents.

5. A method as claimed in claim 4, wherein the estimating of the currents of the switches comprises, for at least one current:
    integrating a bond voltage for a period of time;
    measuring the integrated voltage; and
    estimating the current on the basis of the integrated voltage.

6. A method as claimed in claim 4, wherein the estimating of the currents of the switches comprises:
    comparing the bond voltage with a set limit;
    measuring the time the bond voltage exceeds the set limit; and
    estimating the current on the basis of the measured time.

7. A method as claimed in claim 3, comprising:
    determining the supply control signals by using a balance controller configured to equalize the ratios between the currents.

8. A method as claimed in claim 3, wherein a switching frequency of the modulation of the output of the driver unit after the turn-on commutation transient is at least the cut-off frequency of the low-pass characteristics of the control terminal.

9. A method as claimed in claim 2, wherein the determining of the ratios between the currents of the switches comprises
    estimating the currents of the switches on the basis of bond voltages of the switches; and
    calculating the ratios on the basis of the estimated currents.

10. A method as claimed in claim 9, wherein the estimating of the currents of the switches comprises, for at least one current:
    integrating a bond voltage for a period of time;
    measuring the integrated voltage; and
    estimating the current on the basis of the integrated voltage.

11. A method as claimed in claim 10, comprising:
    determining the supply control signals by using a balance controller configured to equalize the ratios between the currents.

12. A method as claimed in claim 1, wherein the determining of the ratios between the currents of the switches comprises
    estimating the currents of the switches on the basis of bond voltages of the switches; and
    calculating the ratios on the basis of the estimated currents.

13. A method as claimed in claim 12, wherein the estimating of the currents of the switches comprises, for at least one current:
    integrating a bond voltage for a period of time;
    measuring the integrated voltage; and
    estimating the current on the basis of the integrated voltage.

14. A method as claimed in claim 12, wherein the estimating of the currents of the switches comprises:
    comparing the bond voltage with a set limit;
    measuring the time the bond voltage exceeds the set limit; and
    estimating the current on the basis of the measured time.

15. A method as claimed in claim 12, comprising:
    determining the supply control signals by using a balance controller configured to equalize the ratios between the currents.

16. A method as claimed in claim 12, wherein a switching frequency of the modulation of the output of the driver unit after the turn-on commutation transient is at least the cut-off frequency of the low-pass characteristics of the control terminal.

17. A method as claimed in claim 1, comprising:
    determining the supply control signals by using a balance controller configured to equalize the ratios between the currents.

18. A method as claimed in claim 1, wherein a switching frequency of the modulation of the output of the driver unit after the turn-on commutation transient is at least the cut-off frequency of the low-pass characteristics of the control terminal.

* * * * *